US00RE36480E

United States Patent [19]

Bourgeois et al.

[11] E Patent Number: Re. 36,480

[45] Reissued Date of Patent: Jan. 4, 2000

[54] CONTROL AND MONITORING DEVICE FOR A POWER SWITCH

[75] Inventors: Jean-Marie Bourgeois, Divonne; Marco Bildgen, Aix en Pce., both of France

[73] Assignee: STMicroelectronics, S.A., Gentilly, France

[21] Appl. No.: 08/717,135

[22] Filed: Sep. 20, 1996

Related U.S. Patent Documents

Reissue of:

[64] Patent No.: 5,134,322
Issued: Jul. 28, 1992
Appl. No.: 08/637,918
Filed: Jan. 7, 1991

U.S. Applications:

[63] Continuation of application No. 08/282,045, Jul. 28, 1994, abandoned.

[30] Foreign Application Priority Data

Jan. 9, 1990 [FR] France ..... 90 00404

[51] Int. Cl.[7] ..... H03K 17/56

[52] U.S. Cl. ..... 327/427; 327/281; 327/388; 327/399; 327/434

[58] Field of Search ..... 327/381, 388, 327/399, 434, 427, 295, 419, 333, 387, 389, 379; 326/60

[56] References Cited

U.S. PATENT DOCUMENTS

| | | | |
|---|---|---|---|
| 4,039,862 | 8/1977 | Dingwall | 307/247.1 |
| 4,634,903 | 1/1987 | Montorfano | 307/571 |
| 4,697,107 | 9/1987 | Haines | 307/247.1 |
| 4,706,299 | 11/1987 | Jorgensen | 326/60 |
| 4,862,018 | 8/1989 | Taylor | 307/572 |
| 4,864,158 | 9/1989 | Koelle | 307/231 |
| 4,866,556 | 9/1989 | Hebenstreit | 361/91 |
| 4,942,309 | 7/1990 | Chieli | 307/270 |
| 5,025,182 | 6/1991 | Farmer | 307/571 |

FOREIGN PATENT DOCUMENTS

| | | |
|---|---|---|
| 0268930 | 6/1988 | European Pat. Off. . |
| 0330628 | 8/1989 | European Pat. Off. . |

*Primary Examiner*—David Nelms
*Assistant Examiner*—Hoai V. Ho
*Attorney, Agent, or Firm*—Seed and Berry LLP; David V. Carlson

[57] ABSTRACT

A control and monitoring circuit for a power switch comprises a first portion (20) connected to this switch and fed with reference to a floating voltage ($V_F$) of an electrode of this switch, a second portion (10) connected to circuits external to the switch and fed with reference to a fixed voltage, a coder (40) arranged on the side of the second portion and a suitable decoder (50) arranged on the side of the first portion.

29 Claims, 5 Drawing Sheets

CONTROL AND MONITORING DEVICE FOR A POWER SWITCH

Matter enclosed in heavy brackets [ ] appears in the original patent but forms no part of this reissue specification; matter printed in italics indicates the additions made by reissue.

*CROSS-REFERENCE TO RELATED APPLICATION*

*This application is a continuation of U.S. patent application Ser. No. 08/282,045, filed Jul. 28, 1994, now abandoned.*

BACKGROUND OF THE INVENTION

The present invention relates to the control and monitoring of power switches. It more particularly relates to the control of power switches, one terminal of which is at a floating reference voltage, and level translating circuits designed to transmit, from a control circuit at a fixed reference voltage, orders to a power switch control circuit, or conversely, to receive monitoring information.

FIG. 1 very schematically shows the control of a power switch 1 arranged in series with another power switch 2 connected to the ground, these two switches being part, for example, of a bridge circuit. The junction of these two switches is at a floating voltage $V_F$ liable, on the one hand, to reach high voltages and, on the other hand, to be submitted to very abrupt voltage variations, for example several tens of thousands volts per microsecond. The control unit comprises, on the one hand, a control circuit 10 receiving external orders on a terminal 11 and connected to the ground and, on the other hand, a gate control circuit corresponding to each switch, and especially a gate control circuit 20 for switch 1. Between circuits 10 and 20 is inserted a level translating circuit 30 connected to the ground, as well as to a floating voltage $V'_F$ varying with the floating voltage $V_F$.

The gate control circuit 20 is necessarily connected to the floating voltage $V_F$. Therefore, problems are encountered as regards the level translation between the control and monitoring circuits and there generally are two drawbacks, on the one hand, energy consumption when switch 1 is conductive, due to current then flowing in translator 30 submitted to voltage $V'_F$ and, on the other hand, sensitivity to parasitic pulses resulting from fluctuations of the floating voltage $V_F$ and therefore of $V'_F$.

In order to solve consumption problems, pulse control circuits, such as the one illustrated in FIG. 2, have been provided. In this circuit, the portion of the gate control 20 comprises a RS flip-flop 21, the output of which is applied through an amplifier 22 to the gate of the power transistor 1. Each input R and S of the flip flop receives one of the outputs of the level translating circuit, 31 and 32, respectively. The whole set of circuits 21, 22, 31 and 32 is connected to the floating voltage $V'_F$. The level translating circuits 31 and 32 receive control pulses from the control circuit 10 through circuit 33 and 34.

The advantage of this type of circuit is to avoid a significant dissipation of energy in the translating circuit 30 but the circuit is sensitive to parasitic pulses on source $V_L$ or to abrupt variations in voltage $V_F$. In fact, there unavoidably are stray capacitances, for example MOS transistors capacitances 35 and 36, liable to get charged due to abrupt voltage variations and, on account of abrupt variations in the floating voltage value, to let appear parasitic pulses across the terminals or inside circuits 31 and 32, which may cause spurious triggering of the RS flip-flop 21.

SUMMARY OF THE INVENTION

An object of the invention is to provide a circuit which permits avoiding the effect of these stray capacitances.

While the usual approach for achieving this result consists in minimizing values of the stray capacitances the applicant has established that efforts in this way are unavoidably limited; so, the invention provides to transmit orders, between the control circuit connected to the ground and the gate control circuit connected to the floating voltage, through a coding/translating/decoding unit designed to supply operation signals to either input of the RS flip-flop only when one of the inputs receives a predetermined coded signal.

More particularly, the invention relates to a control and monitoring circuit for a power switch comprising a first portion-coupled to this switch and fed with reference to the floating voltage of an electrode of this switch, a second portion coupled to circuits external to the switch and fed with reference to a fixed voltage, a coder arranged near the second portion and a suitable decoder arranged near the first portion. The connection between the two portions is made by two paths respectively connected to the inputs R and S of a flip-flop, and the coder comprises means for simultaneously sending at least one pulse on each path, then at least one pulse on a selected path, the decoder comprising suitable decoding means.

According to an embodiment of the invention, the first and second portions each comprises a coder/decoder.

BRIEF DESCRIPTION OF THE DRAWINGS

The foregoing and other objects, features and advantages of the invention will be apparent from the following detailed description of preferred embodiments as illustrated in the accompanying drawings wherein.

In these various figures, same reference numerals designate identical or analogous components.

DETAILED DESCRIPTION OF THE INVENTION

Figure 3:
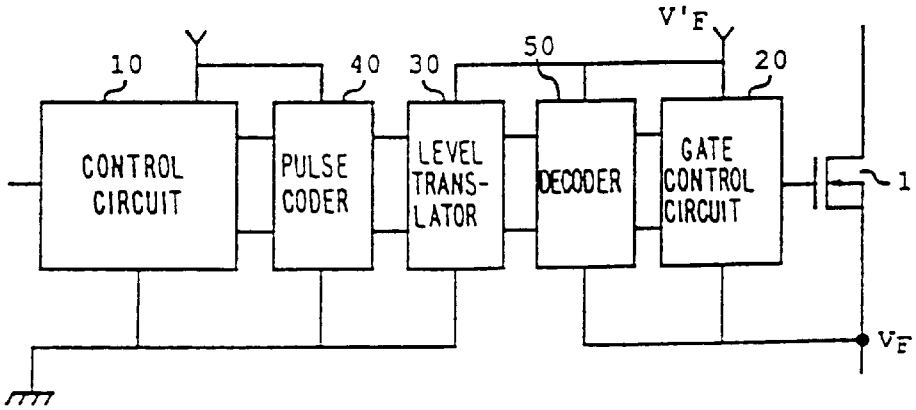
FIG. 3 is a block diagram showing the overall arrangement of a circuit according to the invention.

FIG. 3 globally illustrates in the form of diagrams a circuit according to the invention. This circuit comprises, on the side of the control circuit 10 connected to the ground, a pulse coder 40 and, on the side of the gate control circuit 20 connected to the floating voltage $V_F$, a decoder 50, separated by a level translating circuit 30. The decoder is illustrated at the input of circuit 20. In fact, it will be embedded in this circuit in order to be arranged behind the places where parasitic pulses are liable to appear, to make it possible to differentiate coded pulses from coder 40 from parasitic pulses, as will clearly appear in the following description.

Figure 4:
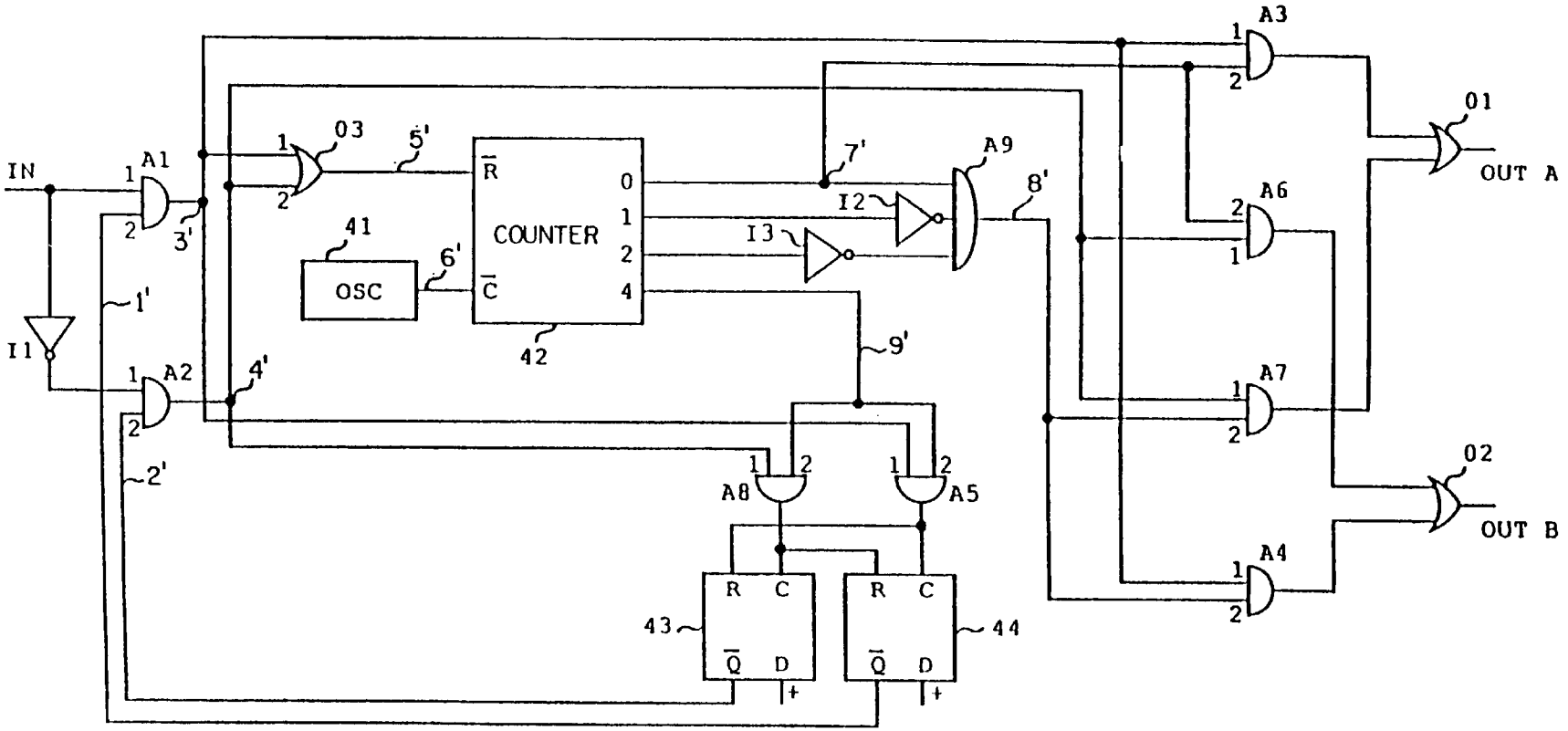
FIG. 4 shows an embodiment of the coding circuit according to the invention.

An exemplary coding circuit 40 as part of control circuit 10 is illustrated in FIG. 4. This circuit 40 comprises a pulse generating oscillator 41, the output of which is applied to the input C of a counter 42. The control signal determining the circuit output appears on its input IN and is set from a low level to a high level when it is desired to determine switching on of the power switch 1. The outputs OUTA and OUTB of this circuit appear at the output of OR gates O1 and O2. Signal IN is applied to the input of an AND gate A1 and, through an inverter I1, to the input of an AND gate A2. The output of gate A1 is sent to a first input of an OR gate O3, and AND gate A3, an AND gate A4 and an AND gate A5. The output of AND gate A2 is sent to the second input of OR gate O3, and to the first inputs of the AND gates A6, A7 and A8.

The output of AND gate A5 is sent to the input R of a D-type flip-flop 43 and to the input C of a D-type flip-flop 44. The output of AND gate AS is sent to the input C of flip-flop 43 and to the input R of flip-flop 44 Inputs D of flip-flops 43 and 44 are set to a positive voltage and the reverse outputs $\overline{Q}$ of these flip-flops are respectively sent to each of the second inputs of AND gates A1 and A2. The output of the OR gate O3 is sent to the input $\overline{R}$ of counter 42. The output of rank 0 of this counter 42 is sent to a first input of a 3-inputs AND gate A9, the second and third inputs of which receive the outputs of rank 1 and 2 of counter 42 through inverters I2 and I3. The fourth output of counter 42 is sent to the second inputs of gates A5 and AS. The output of rank 0 of counter 42 is also sent to the second inputs of gates A3 and A6. The output of gate A9 is sent to the second inputs of gates A4 and A7. Gate O1 receives the outputs of gates A3 and A7 and gate O2 receives the output of 35 gates A4 and A6.

Figure 6:
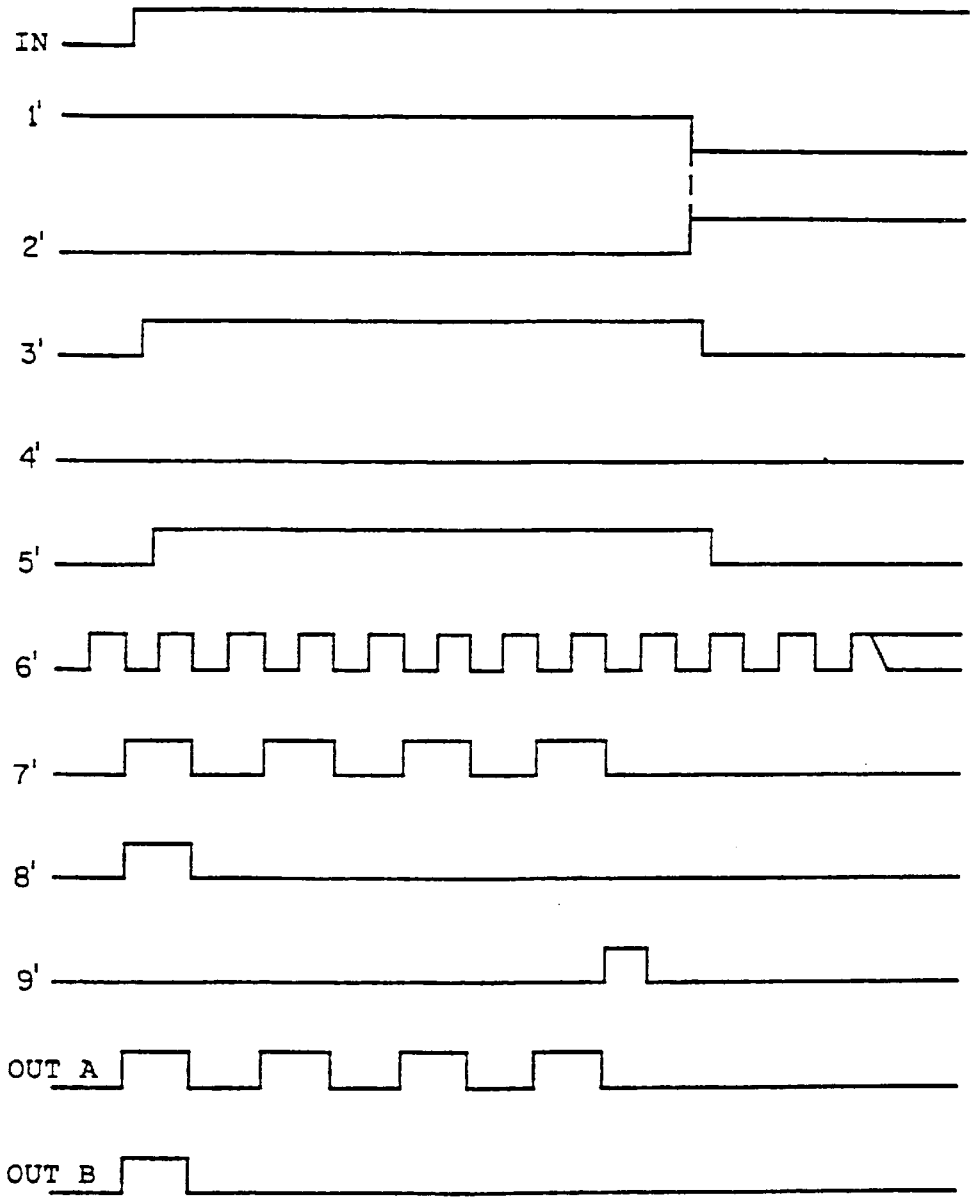
FIG. 6 shows signals at various positions of the coding circuit during a switching on order.

The operation of this circuit will be explained in case of a switching on order of the power switch 1. For this purpose, one has indicated in FIG. 6 signal IN, which passes from a low level to a high level during the reception of a switching on order and the resulting coded output signals OUTA and OUTB, and by numbers, labelled in the same way, the signals appearing at various positions of the circuit.

It is assumed that initially output $\overline{Q}$ of flip-flop 44 (1') is at a high level and that output $\overline{Q}$ of flip-flop 43 (2') is at a low level. The switching of input IN causes the output (3') of AND gate A1 to be set to high level and the output (4') of AND gate A2 remains set to low level. The output (5') of gate O3 is also set to high level, simultaneously with the output (3') of AND gate A1. The output (6') of oscillator 41 continuously supplies square pulses. The signal (7') on the counting output 0 of counter 42 supplies square pulses at a frequency half of that of the oscillator 41. The output (8') of AND gate A9 only supplies the first square wave and the output signal (9') of the counting output 4 of counter 42 supplies a pulse when four square waves are obtained at the counting output 0 (7'). This signal (9') applied to gates A5 and A8 causes signals (1') and (2') to change their state (at outputs $\overline{Q}$ of the D-type flip-flops 44 and 43). This results in the switching of the output state (3') of AND gate A1, and therefore of the output (5') of the OR gate O3, and inhibition of counter 42. It can be seen that the output OUTA of gate O1 corresponds to signal (7') and that the output OUTB of gate O2 corresponds to signal (8'). Therefore, one finally obtains at the circuit output a signal OUTA constituted by four successive pulses and a signal OUTB constituted by one pulse coinciding with the first pulse on output OUTA.

Figure 7:
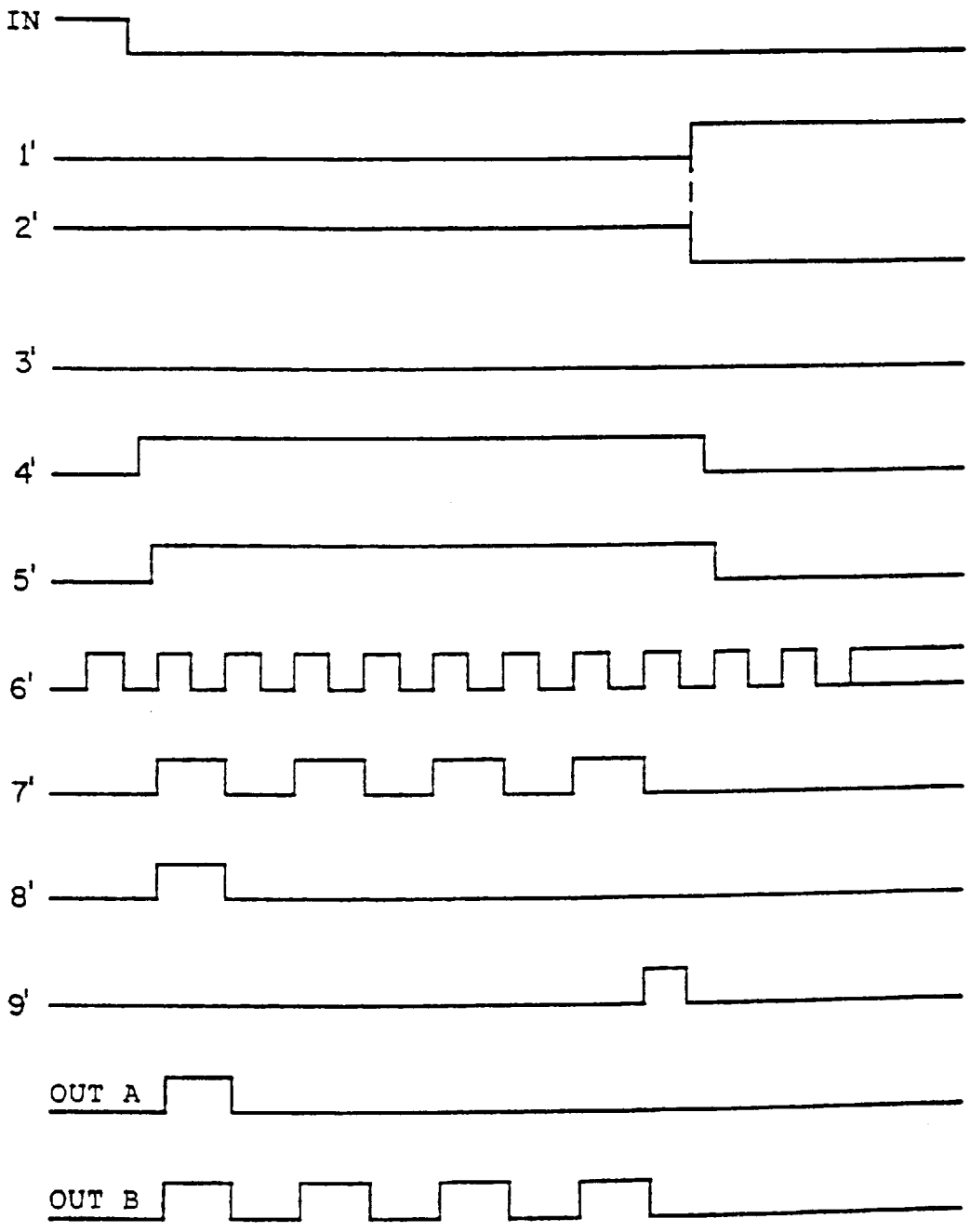
FIG. 7 shows signals at various positions of the coding circuit during a switching off order.

FIG. 7 similarly shows signals appearing at input IN, at positions (1') to (9') and on outputs OUTA and OUTB when signal IN passes from high level to low level for determining the switching off of the power switch 1. This figure can easily be understood by referring to the detailed description of FIG. 6. FIG. 7 shows that a switching off order will correspond to the emission on output OUTA of one pulse, and on output OUTB to emission of four successive pulses, the first of which coincides with the pulse on output OUTA.

Those skilled in the art will note that there are very numerous methods for realizing logic circuits supplying output signals such as those labelled OUTA and OUTB.

However, the choice of the type of control signals supplied at the output of the coding circuit 40 constitutes one of the aspects of the invention. Indeed, according to the invention, and as will be seen later on, it has been noted that it was particularly advantageous to emit as coded signals, first, at least one simultaneous pulse onto the two output paths and, then, a succession of coded pulses on the only path that has to be specifically controlled.

Figure 5:
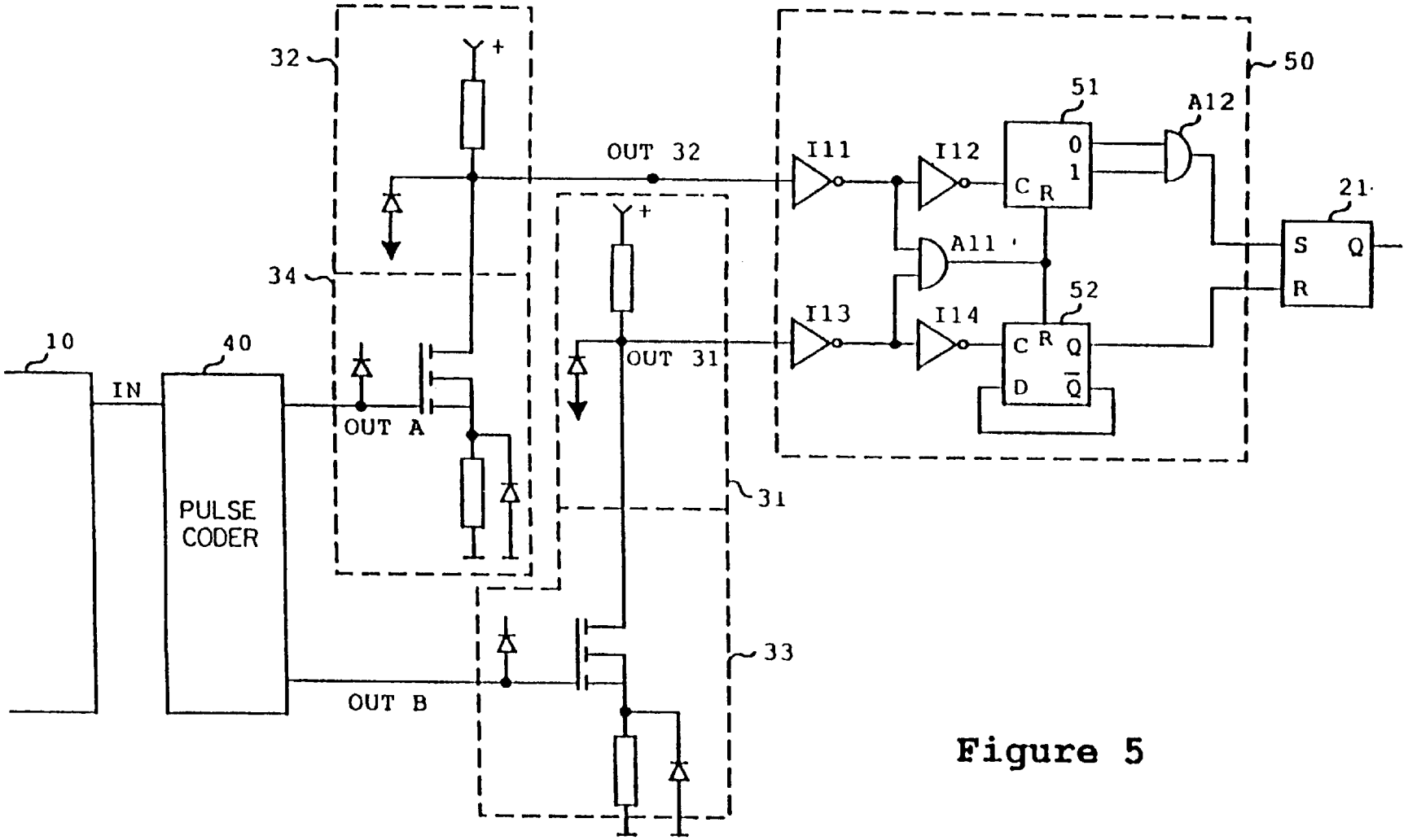
FIG. 5 shows an embodiment of the decoding circuit according to the invention.

FIG. 5 shows a general diagram of the circuit according to the invention, wherein the decoding part is illustrated in greater detail. Control circuit 10 supplying an input signal IN to a coder 40 provided with outputs OUTA and OUTB. These outputs are sent to level translators corresponding to components 31–34 of FIG. 3. These level translators send signals to inputs S and R of a flip-flop 21 through a decoding circuit 50.

Figure 1:
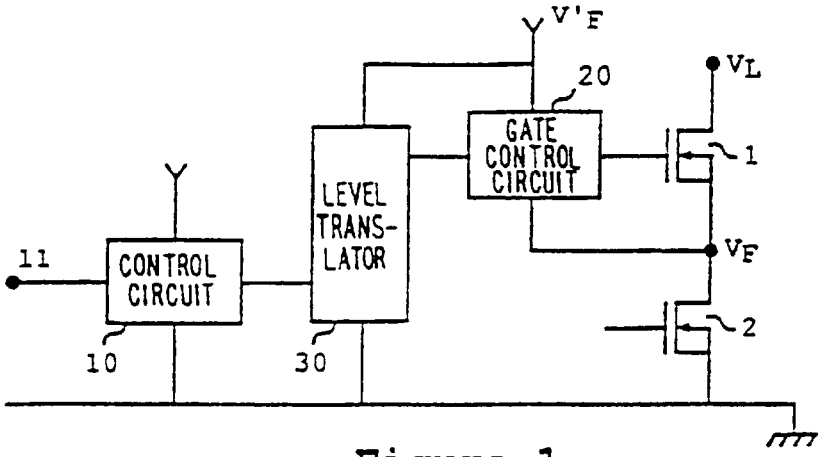
Figure 1 PRIOR ART
FIGS. 1 and 2, already described, are designed to illustrate the state of the art and the problem the invention aims to solve.
Figure 2:
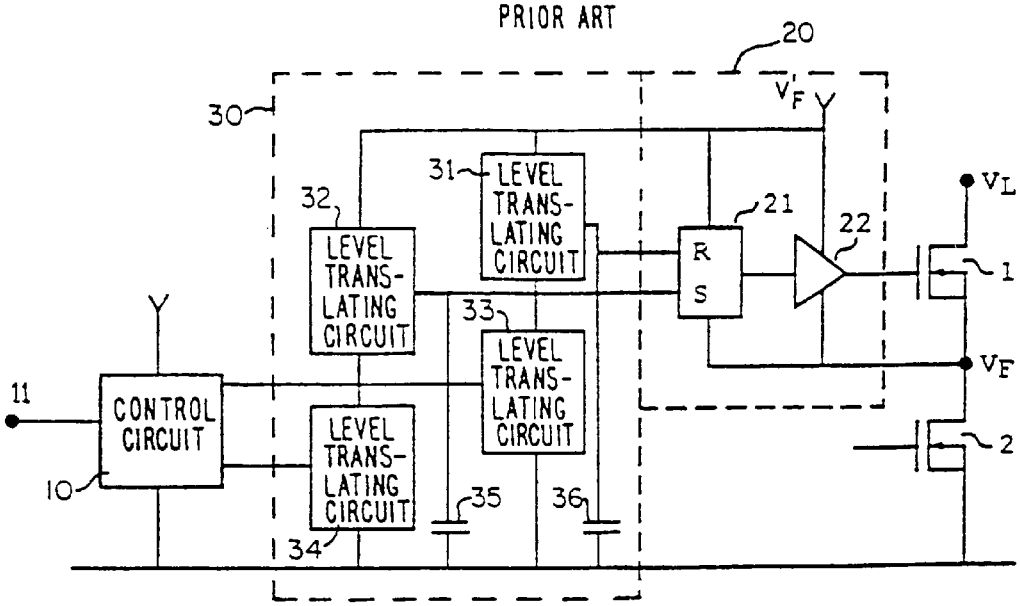
Figure 2 PRIOR ART

Level translators 31, 33 and 32, 34 are conventional circuits, similar to those that would be used in case of FIG. 2. Therefore, they will be not be described in detail. Their outputs are labelled OUT31 and OUT32. In the absence of parasitic pulses, signals on outputs OUT32 and OUT31 respectively correspond to output signals OUTA and OUTB of coder 40.

In the figure, black triangles with their tip oriented downwardly represent the points connected to the floating reference $V_F$.

Decoder 50 receives on its two inputs signals OUT32 and OUT31. Signal OUT32 is sent through two successive inverters I11 and I12 to the input C of a counter 51 and signals OUT31 is sent through two successive inverters I13 and I14 to the input C of a D-type flip-flop 52. The junction of inverters I11 and I12 is connected to the first input of an AND gate A11, the second input of which is connected to the junction of inverters I13 and I14 and the output is connected to the reset terminals R of counter 51 and flip-flop 52. The two outputs 0 and 1 of counter 51 are sent to two inputs of an AND gate A12, the output of which is connected to the input S of flip-flop 21. The Q output of flip-flop 52 is sent to the R input of the RS flip-flop 21. The $\overline{Q}$ output of flip-flop 52 is sent to its input D.

This circuit operates as follows. Signals OUTA and OUTB respectively appear at the output of inverters I12 and I14. AND gate A11 transmits the first pulse which is identical in OUTA and OUTB and resets counter 51 and flip-flop 52. Then:

in case of a switching on order, the signal at the output of inverter I12 exhibits a succession of zero crossing (pulses) while the signal at the output of inverter I14 remains set to high level. As a result, counter 51 supplies simultaneous high outputs after counting a predetermined number of pulses (here 3) and then AND gate A12 controls the S input of flip-flop 21, the Q output of which then passes to high level.

in case of a switching off order, inverter I14 supplies a succession of pulses at the clock input C of flip-flop 52 and, as soon as there is a first non-simultaneous pulse on the other path, the output Q of this flip-flop, is set to high level and resets flip-flop 21.

It will be noted that parasitic pulses on the floating reference $V_F$, resulting for example from very high voltage gradients, cause simultaneous pulses to occur at outputs OUT32 and OUT31 of the level translators. With the coding system according to the invention, providing simultaneous resetting pulses of the decoder before any information signal is sent, such parasitic pulses will have no effect on the circuit operation.

According to another advantage of the invention, the switching on signal resulting from the output of counter 51 sent to input S of flip-flop 21 is delayed while the switching off signal resulting from the output Q of flip-flop 52 is sent to the input R of flip-flop 21 and is immediately transmitted. Then, a slight delay inherently occurs between a switching on and a switching off order, this delay being adjustable with the oscillation frequency of coder 40. Since, as explained above, a circuit according to the invention is designed to be inserted in a bridge-connected control circuit, this prevents two bridge power switches from being simultaneously switched on, which might cause shorting of a bridge leg.

Whereas a coder arranged on the side of circuits connected to the ground and a decoder arranged on the side of circuits connected to the floating voltage have been described, each of these components can be replaced by a coder/decoder for sending back monitoring information about the operating state of a floating power switch.

I claim:

1. A control and monitoring circuit for a power switch comprising:

a first control circuit connected to said power switch and adapted to receive a floating voltage of an electrode of said power switch;

a second control circuit connected to circuits external to said power switch and adapted to receive a fixed voltage;

a coder circuit connected to said second control circuit; and a decoding circuit connected to said first control circuit; wherein said coder circuit is connected to said decoder circuit by first and second paths; and said coder circuit comprises (a) means for sending a plurality of signals on one of said first and second paths, and (b) means for sending one signal on the other of said first and second paths, wherein at least one signal of said plurality of signals is simultaneous with said one signal.

2. The control and monitoring circuit according to claim 1, wherein said plurality of signals and said one signal are pulses;

said coder circuit includes means to control sending pulses on said first and second paths in response to input control signals; and said decoder circuit includes means for generating control signals in response to said pulses on said first and second paths, said control signals being input to said first control circuit on said first and second paths.

3. The control and monitoring circuit according to claim 2, wherein said first control circuit comprises a flip-flop;

one of said first and second paths is connected to a set input of said flip-flop; and the other one of said first and second paths is connected to a reset input of said flip-flop.

4. A control and monitoring circuit for a power switch comprising:

a first control circuit connected to said power switch and adapted to receive a floating voltage of an electrode of said power switch;

a second control circuit connected to circuits external to said power switch and adapted to receive a fixed voltage;

a coder circuit connected to said second control circuit; and a decoding circuit connected to said first control circuit, wherein said coder circuit and said decoder circuit are interconnected by first and second paths, signals on one of said first and second paths controlling said power switch to turn on and signals on the other one of said first and second paths controlling said power switch to turn off.

5. The control and monitoring circuit according to claim 4, wherein said signals are pulses;

said coder circuit includes means to generate *said* pulses for said first and second paths in response to an input control signal; and said decoder circuit includes means for generating control signals in response to said pulses on said first and second paths, said control signals being input to said first control circuit on said first and second paths.

6. The control and monitoring circuit according to claim 4, wherein said first control circuit comprises a flip-flop;

one of said first and second paths is connected to a set input of said flip-flop; and the other one of said first and second paths is connected to a reset input of said flip-flop.

7. In a device comprising a power switch, a first control circuit adapted to receive a floating voltage of an electrode of said power switch, a decoder circuit, a coder circuit and a second control circuit adapted to receive a fixed voltage, said second control circuit receiving an external control signal to control the on/off function of said power switch and connected to said coder circuit, said coder circuit connected to said decoder circuit by first and second paths, and said decoder circuit connected to said first control circuit and outputting control signals to said first control circuit, a method of controlling said power switch comprising:

generating pulses for said first and second paths in response to said external control signal, sending a plurality of said pulses on one of said first and second paths; and sending one pulse on the other of said first and second paths, said one pulse being simultaneous with at least one pulse of said plurality of said pulses.

8. The method according to claim 7, wherein the step of sending said plurality of pulses on one of said first and second paths control said power switch to turn on; and the step of sending one pulse on said other of said first and second paths controls said power switch to turn off.

*9. A circuit comprising:*

*a first control circuit having an output terminal to provide an output voltage adapted to change from a low state to a high state, the first control circuit also having a first voltage supply terminal adapted to be connected to a first reference voltage potential;*

*a second control circuit having an input terminal, and having a ground terminal adapted to be connected to a second fixed reference voltage potential which is a different value than the first reference voltage potential;*

*a coder circuit connected to said second control circuit;*

*a decoder circuit connected to said first control circuit; and*

*first and second electrical paths interconnecting the coder circuit and the decoder circuit, a signal on the first path controlling the output terminal of the first control circuit to output a high voltage potential and a signal on the second path controlling the output terminal to output a lower voltage potential.*

*10. The circuit according to claim 9, further including:*

*a ground terminal on the decoder circuit;*

*an electrical connection from the first voltage supply terminal of the first control circuit to the ground terminal of the decoder circuit.*

*11. The circuit according to claim 9, further including a power switch connected to the output of the first control circuit such that a signal on the first path controls the power switch to turn on and a signal on the second path controls the power switch to turn off.*

*12. The circuit according to claim 11 wherein the first reference voltage is a floating voltage adapted to be received as an input from an electrode of the power switch.*

*13. The circuit according to claim 9 wherein the first voltage supply terminal is a around voltage terminal.*

*14. The circuit according to claim 13 wherein the first reference voltage is a floating voltage.*

*15. The circuit according to claim 9, further including a second voltage supply terminal as a part of the first control circuit.*

*16. A method for controlling a signal level, comprising:*

*receiving a first transition edge of a control signal;*

*coding said first transition edge as both a first plurality of pulses and as a first pulse that is separate from said plurality of pulses and that substantially coincides in time with one of said plurality of pulses;*

*providing said plurality of pulses on a first path;*

*providing said pulse on a second path;*

*decoding said plurality of pulses on said first path and said pulse on said second path to obtain a decoded control signal; and*

*generating in response to said decoded control signal said signal level having a first value.*

*17. The method of claim 16, further comprising:*

*receiving a second transition edge of said control signal;*

*coding said second transition edge as a second plurality of pulses and a second pulse;*

*providing said second plurality of pulses on said second path;*

*providing said second pulse on said first path;*

*decoding said second plurality of pulses on said second path and said second pulse on said first path to obtain said decoded control signal; and*

*generating in response to said decoded control signal said signal level having a second value.*

*18. The method of claim 20 wherein:*

*said first transition edge of said control signal transitions from a first state to a second state; and*

*said second transition edge of said control signal transitions from said second state to said first state.*

*19. The method of claim 18 wherein said first state equals a first high logic level and wherein said first value equals a second high logic level.*

*20. The method of claim 18 wherein said first state equals a first low logic level and wherein said first value equals a second low logic level.*

*21. A method for controlling a power switch, comprising:*

*receiving a first transition edge of a control signal;*

*coding said first transition edge as both a first plurality of signals and as a first signal that is generated substantially simultaneously with one of said plurality of signals;*

*providing said plurality of signals on one of first and second signal paths;*

*providing said signal on the other of said first and second signal paths;*

*decoding said plurality of signals from said first signal path and said signal from said second signal path to obtain a decoded control signal;*

*generating in response to said decoded control signal a switching signal; and*

*providing said switching signal to a control terminal of said power switch.*

*22. The method of claim 21, further comprising referencing said switching signal to a voltage that is coupled to a terminal of said power switch other than said control terminal.*

*23. A circuit comprising:*

*a first control circuit having an output terminal that provides a control signal having first and second states, the first control circuit also having a first voltage supply terminal that is coupled to receive a first reference voltage potential;*

*a second control circuit having an input terminal, and having a ground terminal coupled to receive a second fixed reference voltage potential that is a different value than the first reference voltage potential;*

*a coder circuit coupled to said second control circuit;*

*a signal-level translator coupled to said coder circuit;*

*a decoder circuit coupled to said signal-level translator; and*

*first and second electrical paths intercoupling the coder circuit, the signal-level translator, and the decoder circuit, a first combination of signals on the first and second paths causing the first control circuit to generate the control signal having the first state, and a second combination of signals on the first and second paths causing the first control circuit to generate the control signal having the second state.*

*24. The circuit of claim 23 wherein the decoder circuit includes a ground terminal that is coupled to the first reference voltage potential.*

*25. The circuit according to claim 23, further comprising a power switch having a control terminal coupled to the output terminal of the first control circuit such that one of the first and second combinations of signals on the first and second paths controls the power switch to turn on, and the other of the first and second combinations of signals controls the power switch to turn off.*

*26. The circuit according to claim 25 wherein the first reference voltage potential is a floating voltage that is coupled to a drive electrode of the power switch.*

*27. The circuit according to claim 23 wherein the first voltage supply terminal of the first control circuit is a ground terminal.*

*28. The circuit of claim 27 wherein the first reference voltage potential is a floating voltage.*

*29. The circuit of claim 23 wherein the first control circuit comprises a second voltage supply terminal.*

* * * * *

UNITED STATES PATENT AND TRADEMARK OFFICE

CERTIFICATE OF CORRECTION

PATENT NO : Re. 36,480
DATED : Jan. 4, 2000
INVENTOR(S) : Jean-Marie Bourgeois and Marco Bildgen It is certified that error appears in the above-identified patent and that said Letters Patent is hereby corrected as shown below:

Claim 13, column 7, line 24, "is a around voltage" should read --is a ground voltage--.

Signed and Sealed this

Thirteenth Day of March, 2001

*Attest:*

Nicholas P. Godici

NICHOLAS P. GODICI

*Attesting Officer*

*Acting Director of the United States Patent and Trademark Office*